United States Patent
Stefanov et al.

(10) Patent No.: US 11,848,553 B2
(45) Date of Patent: Dec. 19, 2023

(54) ELECTRO-STATIC DISCHARGE DEVICE WITH INTEGRATED CAPACITANCE

(71) Applicant: NXP USA, Inc., Austin, TX (US)

(72) Inventors: Evgueniy Nikolov Stefanov, Vieille Toulouse (FR); Pascal Kamel Abouda, Saint Lys (FR)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 17/454,929

(22) Filed: Nov. 15, 2021

(65) Prior Publication Data

US 2022/0158444 A1   May 19, 2022

(30) Foreign Application Priority Data

Nov. 17, 2020   (EP) ..................... 20306393

(51) Int. Cl.
*H02H 9/04* (2006.01)
*H01L 27/02* (2006.01)

(52) U.S. Cl.
CPC ......... *H02H 9/044* (2013.01); *H01L 27/0248* (2013.01); *H02H 9/04* (2013.01); *H02H 9/046* (2013.01); *H01L 27/02* (2013.01)

(58) Field of Classification Search
CPC ...... H02H 9/044; H02H 9/046; H02H 11/003; H02H 9/00; H01L 27/0248; H01L 27/0255; H01L 27/0262; H01L 27/0266
USPC ..................... 361/56; 257/355–360
See application file for complete search history.

(56) References Cited

U.S. PATENT DOCUMENTS

| | | | |
|---|---|---|---|
| 9,462,674 B1* | 10/2016 | Fakhruddin | G06F 30/367 |
| 9,490,243 B2 | 11/2016 | Laine et al. | |
| 9,620,495 B2 | 11/2017 | Besse et al. | |
| 9,948,091 B1* | 4/2018 | Smith | A61N 1/3931 |
| 10,727,221 B2 | 7/2020 | Zhan et al. | |
| 2007/0241422 A1* | 10/2007 | Chen | H01L 23/5223 257/528 |
| 2008/0173945 A1* | 7/2008 | Wu | H01L 24/11 438/237 |
| 2010/0246079 A1* | 9/2010 | Suzuki | H01L 27/0285 257/E29.242 |
| 2013/0208395 A1* | 8/2013 | Bultitude | H01C 1/14 361/275.1 |
| 2014/0145301 A1* | 5/2014 | Moghe | H01L 23/5222 257/532 |
| 2016/0154989 A1* | 6/2016 | Lin | G06V 40/1329 216/17 |

* cited by examiner

*Primary Examiner* — Danny Nguyen

(57) ABSTRACT

An integrated electro-static discharge (ESD) device has a set of metal layers. Each metal layer in the set has one or more first-terminal metal features interleaved with one or more second-terminal metal features in a lateral direction, and at least one first-terminal metal feature in a metal layer of the set overlaps in a normal direction at least one second-terminal metal feature in an adjacent metal layer of the set. By overlapping metal features in the normal direction, capacitance can be added to the ESD device, which improves its operating characteristics, without increasing the layout size of the ESD device.

19 Claims, 7 Drawing Sheets

100

100

500

500

500

ELECTRO-STATIC DISCHARGE DEVICE WITH INTEGRATED CAPACITANCE

CROSS-REFERENCE TO RELATED APPLICATIONS

This application claims the priority under 35 U.S.C. § 119 of European Patent application no. 20306393.8, filed on Nov. 17, 2020, the contents of which are incorporated by reference herein.

BACKGROUND

Field of the Disclosure

The present disclosure relates to electronics and, more specifically but not exclusively, to the use of electro-static discharge (ESD) devices to protect electronics, such as physical-layer components, from high-voltage transients.

Description of the Related Art

This section introduces aspects that may help facilitate a better understanding of the disclosure. Accordingly, the statements of this section are to be read in this light and are not to be understood as admissions about what is prior art or what is not prior art.

It is known to use an electro-static discharge (ESD) device in a physical-layer component to protect other electronics from damage due to high-voltage transients that may appear on a transmission line connected to an input/output (I/O) port of such a physical-layer component. In operation, an ESD device provides a path to shunt such high voltages to ground, thereby protecting other circuitry of the physical-layer component or even other circuitry downstream of the physical-layer component.

FIG. 1 is a schematic circuit diagram of a conventional ESD device 100 comprising (i) a bi-directional blocking silicon-controlled rectifier (SCR) 102 connected in parallel with (ii) four floating-base PNP bi-polar transistors 104 between an I/O terminal 106 and a ground terminal 108.

FIG. 2 is a cross-sectional side view of the conventional ESD device 100 of FIG. 1 including the silicon part of the device as well as the front end with five metal layers connecting the I/O and ground terminals 106 and 108, where the SCR 102 and each PNP transistor 104 is separated with a deep trench. As shown in FIG. 2, the ESD device 100 has three metal layers M1, M2, and M3 separated by dielectric material and interconnected in the normal direction by metal vias, where each metal layer has first-terminal metal features 202 connected to the I/O terminal 106 and interleaved with second-terminal metal features 204 connected to the ground terminal 108. Note that the ESD device 100 has two other metal layers M4 and M5 that also have metal features that are different from the metal features of metal layers M1-M3. Note further that, within each of metal layers M1-M3, the first-terminal metal features 202 are separated from the second-terminal metal features 204 in the lateral direction of FIG. 2. In addition, while (i) first-terminal metal features 202 in the different metal layers M1-M3 overlap one another in the normal direction and (ii) second-terminal metal features 204 in the different metal layers M1-M3 overlap one another in the normal direction, there is no overlapping in the normal direction between any first-terminal metal feature 202 and any second-terminal metal feature 204 in different metal layers M1-M3.

FIG. 3 is a top view of the front end of the rectangular layout of the conventional ESD device 100 of FIGS. 1 and 2 having the SCR 102 and the four PNP transistors 104, where the cross-sectional view of FIG. 2 is along the width W of FIG. 3.

FIG. 4 is a schematic circuit diagram of a conventional, integrated, CAN physical-layer component 400 for a Controller Area Network (CAN) configured for Conducted Emission (CE) testing. When configured in a CAN network, the CAN physical-layer component 400 converts an incoming differential signal received at the CANH and CANL ports from a CAN differential transmission line into an outgoing single-ended signal presented at the RXD port. In addition, the CAN physical-layer component 400 converts an outgoing single-ended signal received at the TXD port into an outgoing differential signal presented at the CANH and CANL ports for transmission along the CAN differential transmission line. As shown in FIG. 4, in addition to other circuitry that supports the differential-to-single-ended and singled-ended-to-differential conversion functions, the CAN physical-layer component 400 has two instances of the ESD device 100 of FIGS. 1-3: one ESD device 100 to protect the other circuitry in the physical-layer component 400 from high-voltage transients that may appear on the CANH wire of the CAN transmission line and the other ESD device 100 to protect the other circuitry in the physical-layer component 400 from high-voltage transients that may appear on the CAN transmission line's CANL wire.

As shown in FIG. 4, the CAN physical-layer component 400 is connected to a Common-Mode Choke (CMC) 410 and termination circuitry 420 to support 150-ohm CE testing of the CAN network.

SUMMARY

One of the drawbacks of the conventional CAN physical-layer component 400 of FIG. 4 is its inability to filter out common-mode noise sufficiently when there is significant asymmetry between the differential-signal components on the CAN transmission line. To address this drawback, parallel capacitance can be added to each instance of the ESD device. According to the present disclosure and as described further below, that parallel capacitance is integrated into the front end of the ESD device within its active area by modifying the sizes of at least some of the first-terminal and second-terminal metal features in the metal layers M1-M3 of the ESD device to increase the capacitances both (i) between first-terminal and second-terminal metal features within each metal row (i.e., in the lateral direction) as well as (ii) between first-terminal and second-terminal metal features within adjacent metal rows (i.e., in the normal direction). As a result, additional parallel capacitance is added between the I/O and ground terminals of the ESD device, which additional parallel capacitance improves the ability of the resulting physical-layer component 400 to filter out common-mode noise even in the presence of significant asymmetry between the differential-signal components.

In certain embodiments, the present disclosure is an article of manufacture comprising an integrated electro-static discharge (ESD) device, the ESD device comprising a set of metal layers, wherein each metal layer in the set has one or more first-terminal metal features interleaved with one or more second-terminal metal features in a lateral direction; and at least one first-terminal metal feature in a metal layer of the set overlaps in a normal direction at least one second-terminal metal feature in an adjacent metal layer of the set.

In at least some of the above embodiments, each interior first-terminal metal feature in each metal layer of the set overlaps in the normal direction with at least one second-terminal metal feature in an adjacent metal layer of the set; and each interior second-terminal metal feature in each metal layer of the set overlaps in the normal direction with at least one first-terminal metal feature in an adjacent metal layer of the set.

In at least some of the above embodiments, the first-terminal and second-terminal metal features are part of a parallel combination of a rectifier and at least one transistor; and the first-terminal and second-terminal metal features provide capacitance in parallel with the parallel combination.

In at least some of the above embodiments, the rectifier comprises a diode.

In at least some of the above embodiments, the rectifier comprises back-to-back diodes.

In at least some of the above embodiments, the rectifier is a bi-directional blocking silicon-controlled rectifier (SCR).

In at least some of the above embodiments, the parallel combination comprises one or more floating-base PNP transistors.

In at least some of the above embodiments, the ESD device further comprises one or more other metal layers that are not in the set of metal layers.

In at least some of the above embodiments, the article comprises an integrated physical-layer component comprising the ESD device.

In at least some of the above embodiments, the physical-layer component is a differential physical-layer component comprising two instances of the ESD component, one for each differential input of the differential physical-layer component.

In at least some of the above embodiments, the article comprises an in-vehicle network (IVN) product comprising the differential physical-layer component.

BRIEF DESCRIPTION OF THE DRAWINGS

Embodiments of the disclosure will become more fully apparent from the following detailed description, the appended claims, and the accompanying drawings in which like reference numerals identify similar or identical elements.

DETAILED DESCRIPTION

Detailed illustrative embodiments of the present disclosure are disclosed herein. However, specific structural and functional details disclosed herein are merely representative for purposes of describing example embodiments of the present disclosure. The present disclosure may be embodied in many alternate forms and should not be construed as limited to only the embodiments set forth herein. Further, the terminology used herein is for the purpose of describing particular embodiments only and is not intended to be limiting of example embodiments of the disclosure.

As used herein, the singular forms "a," "an," and "the," are intended to include the plural forms as well, unless the context clearly indicates otherwise. It further will be understood that the terms "comprises," "comprising," "contains," "containing," "includes," and/or "including," specify the presence of stated features, steps, or components, but do not preclude the presence or addition of one or more other features, steps, or components. It also should be noted that in some alternative implementations, the functions/acts noted may occur out of the order noted in the figures. For example, two figures shown in succession may in fact be executed substantially concurrently or may sometimes be executed in the reverse order, depending upon the functions/acts involved.

Figure 5:
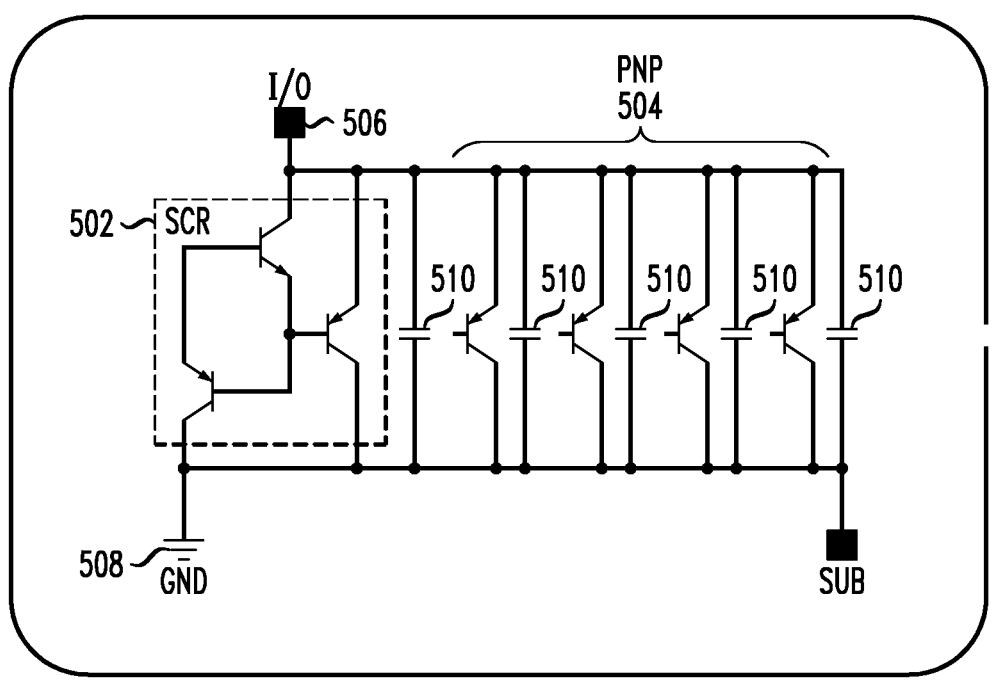
FIG. 5 is a schematic circuit diagram of an ESD device according to certain embodiments of the disclosure.

FIG. 5 is a schematic circuit diagram of an ESD device 500 according to certain embodiments of the disclosure. In addition to (i) a bi-directional blocking SCR 502 connected in parallel with (ii) four floating-base PNP bi-polar transistors 504 between an I/O terminal 506 and a ground terminal 508, similar to the conventional ESD device 100 of FIGS. 1-3, the ESD device 500 also has additional parallel capacitance between the I/O and ground terminals 506 and 508, represented in FIG. 5 as five individual capacitors 510 that, as described below, are implemented in the front ends of the corresponding PNP transistors.

Figure 6:
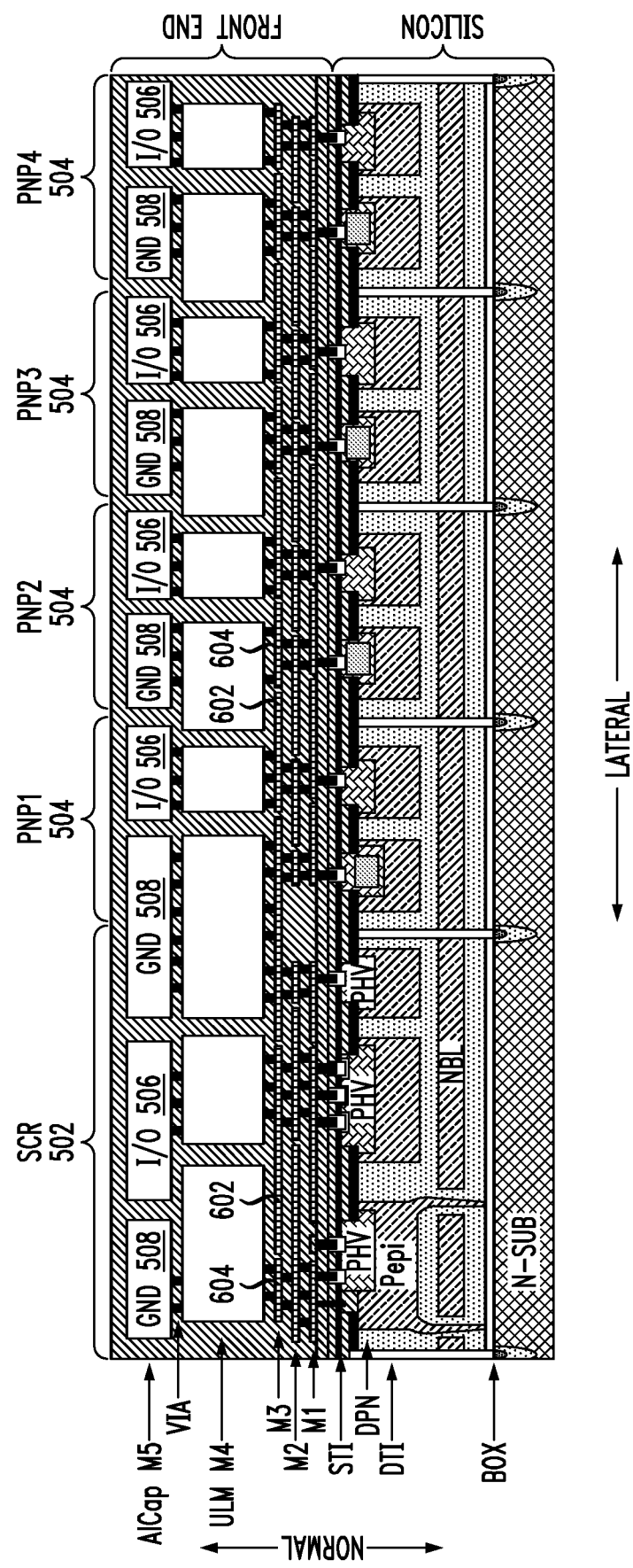
FIG. 6 is a cross-sectional side view of the ESD device of FIG. 5.

FIG. 6 is a cross-sectional side view of the ESD device 500 of FIG. 5. As shown in FIG. 6 and similar to the conventional ESD device 100 of FIGS. 1-3, the ESD device 500 has three metal layers M1, M2, and M3 separated by dielectric material and interconnected by metal vias, where each metal layer has first-terminal metal features 602 connected to the I/O terminal 506 and interleaved with second-terminal metal features 604 connected to the ground terminal 508.

Figure 1:
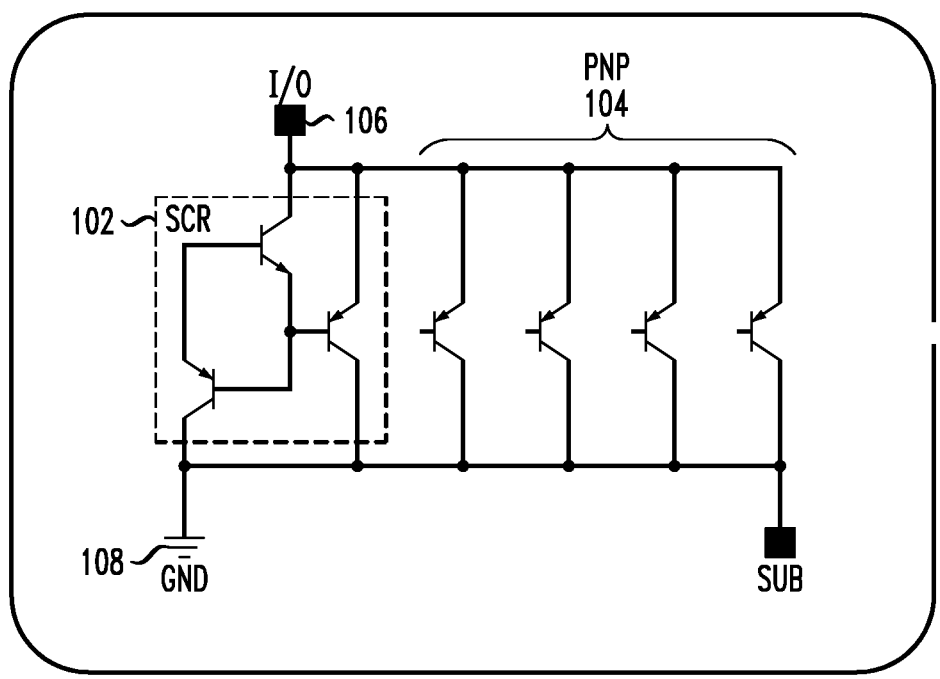
FIG. 1 is a schematic circuit diagram of a conventional ESD device.
Figure 2:
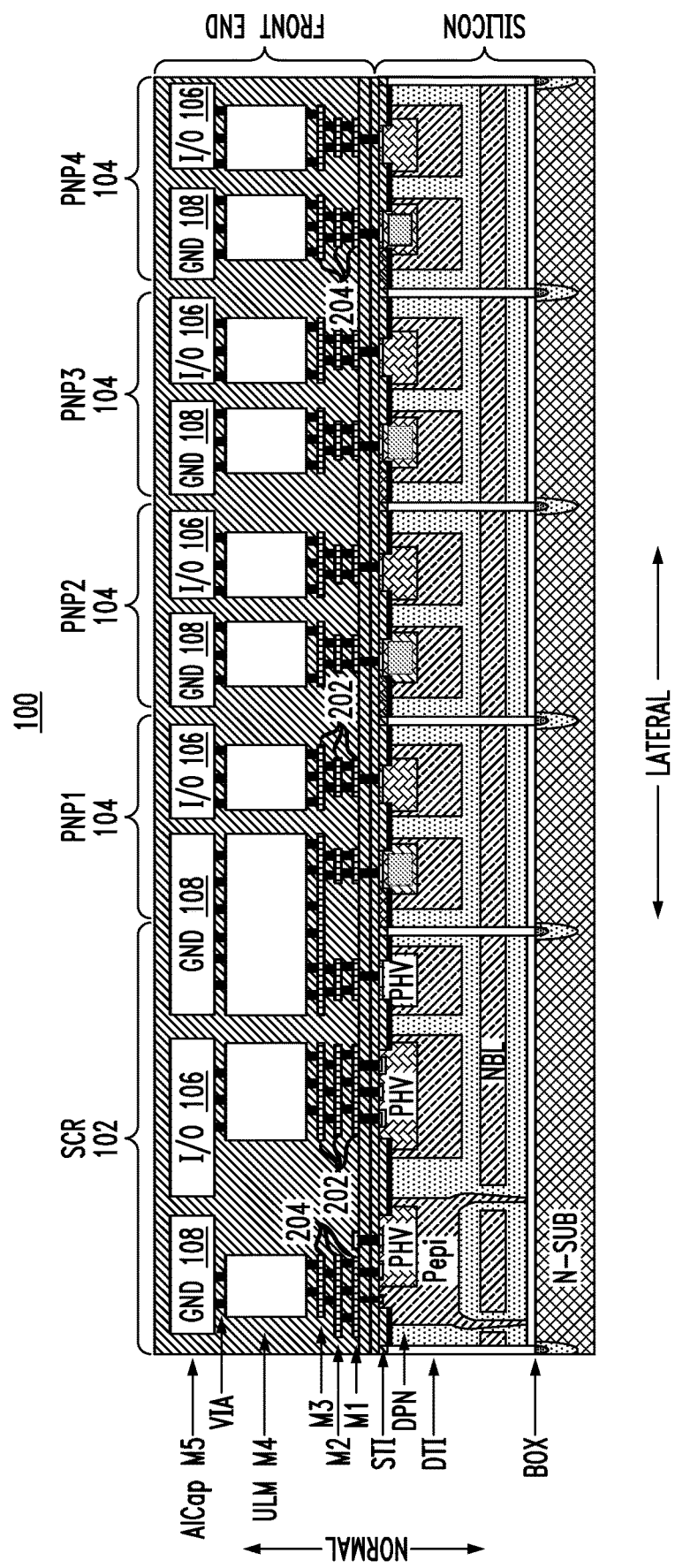
FIG. 2 is a cross-sectional side view of the conventional ESD device of FIG. 1.
Figure 3:
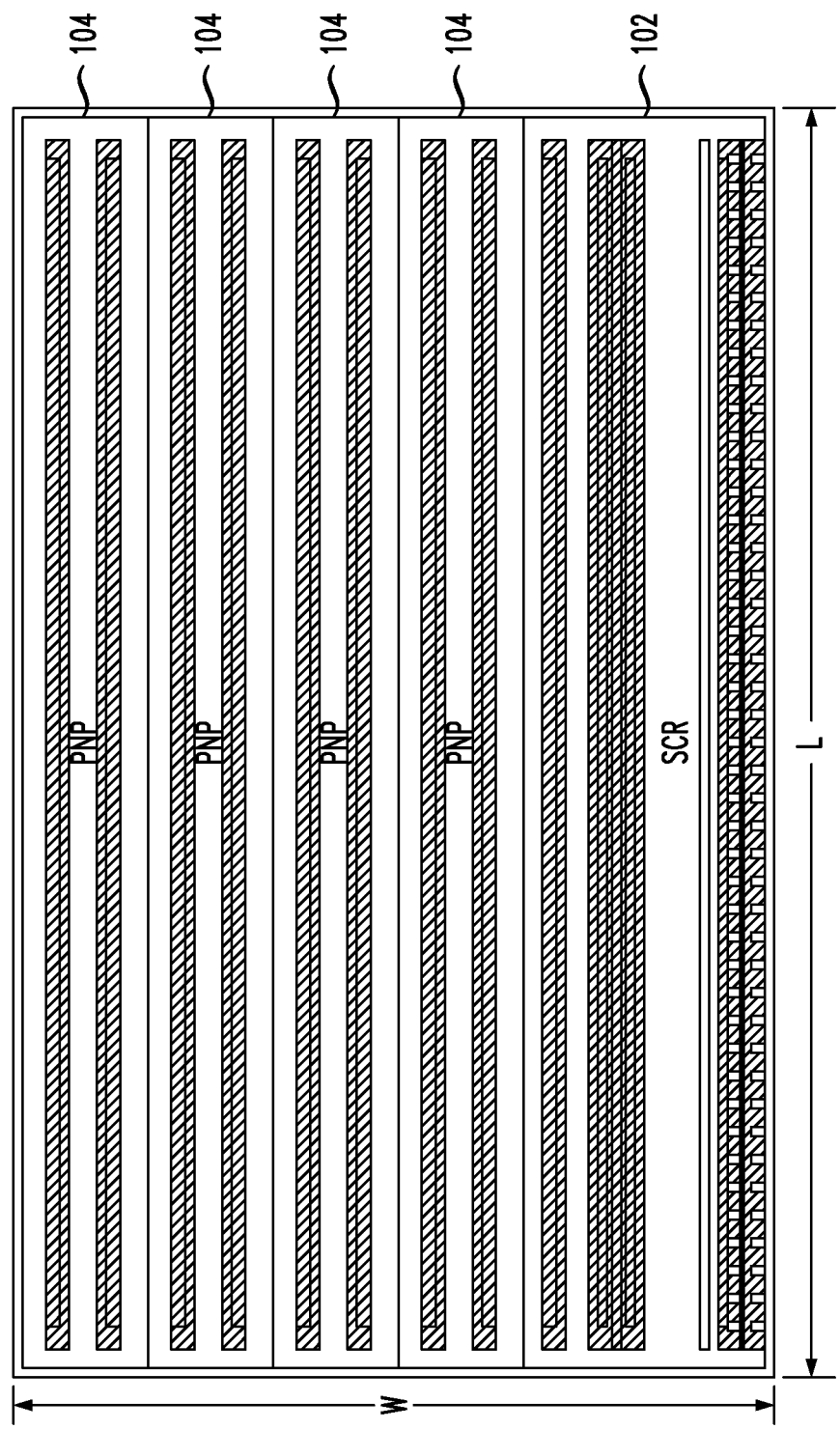
FIG. 3 is a top view of the front end of the rectangular layout of the conventional ESD device of FIGS. 1 and 2.

Note that, within each of metal layers M1-M3, some of the first-terminal and second-terminal metal features 602 and 604 extend laterally such that the first-terminal metal features 602 are closer to the second-terminal metal features 604 in the lateral direction of FIG. 6 than are the corresponding metal features 202 and 204 in the conventional ESD device 100 of FIGS. 1-3.

In addition, for each interior metal feature 602/604 (that is, a metal feature that is not on either the left edge or the right edge of the ESD device 500 as depicted in FIG. 6), the interior metal feature 602/604 overlaps with at least one other metal feature 604/602 of the other terminal in an adjacent metal layer in the normal direction, where that other metal feature 604/602 may be an interior metal feature or an edge metal feature.

Figure 7:
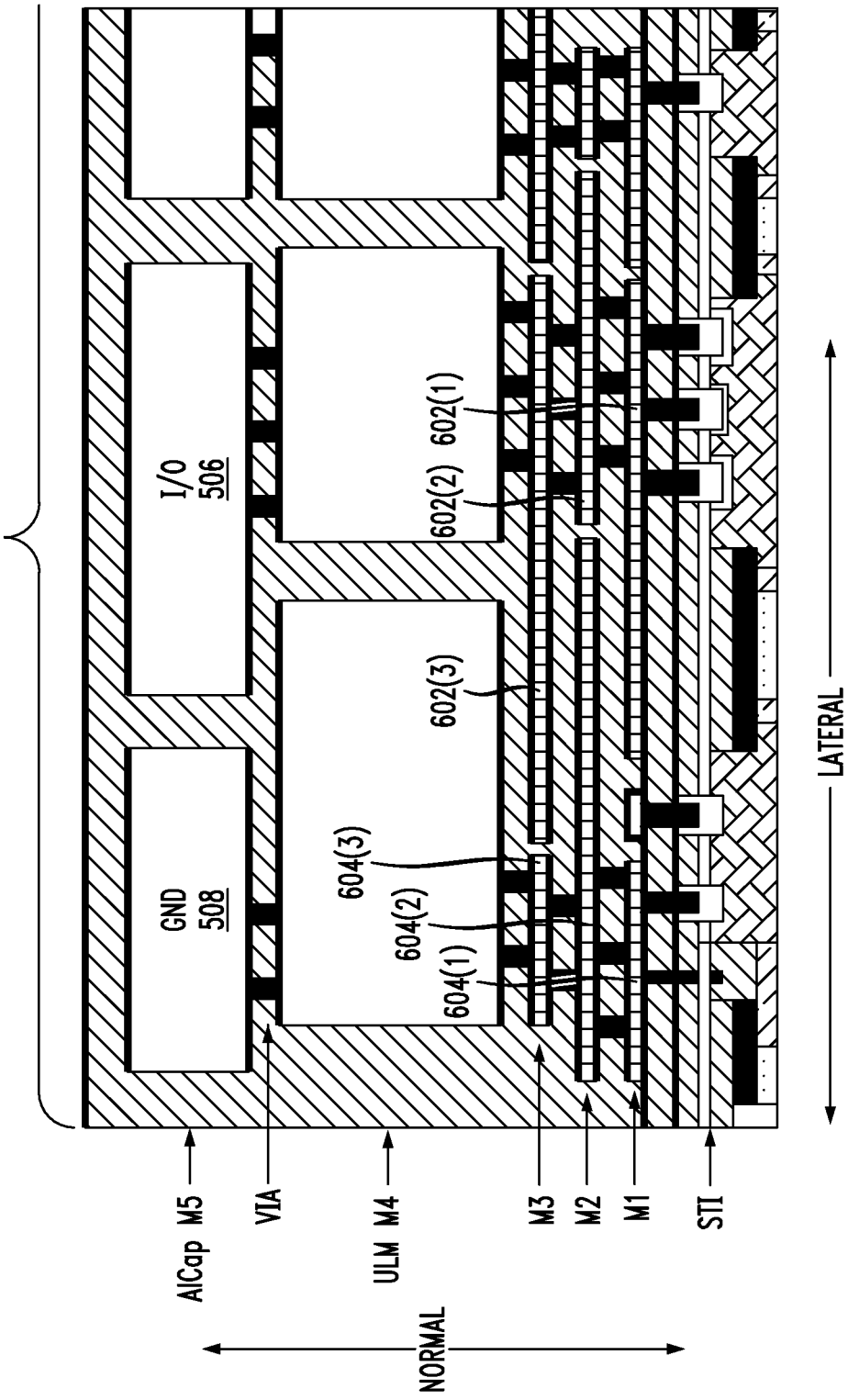
FIG. 7 is an expanded view of the metal layers of the left-most portion of the ESD device as shown in FIG. 6.

FIG. 7 is an expanded view of the metal layers of the left-most portion of the ESD device 500 as shown in FIG. 6, where (i) first-terminal metal features 602(1)-602(3) of metal layers M1-M3, respectively, are connected to the I/O terminal 506 and (ii) second-terminal metal features 604(1)-604(3) of metal layers M1-M3, respectively, are connected to the ground terminal 508. As shown in FIG. 6, the first-terminal metal features 602(1) and 602(3) extend laterally to the left more than the corresponding first-terminal metal features 202 in the conventional ESD device 100 of FIGS. 1-3, and the second-terminal metal feature 604(2)

extends laterally to the right more than the corresponding second-terminal metal feature 204 in the conventional ESD device 100 of FIGS. 1-3.

As a result of those extensions, in metal layer M1, the first-terminal metal feature 602(1) is closer in the lateral direction to the second-terminal metal feature 604(1) than are the corresponding first-terminal and second-terminal metal features 202 and 204 in the conventional ESD device 100 of FIGS. 1-3, and similarly for the metal features 602(2) and 604(2) in metal layer M2 and for the metal features 602(3) and 604(3) in metal layer M3.

As a further result of those extensions, the second-terminal metal feature 604(2) in metal layer M2 overlaps in the normal direction with both the first-terminal metal feature 602(1) in metal layer M1 and the first-terminal metal feature 602(3) in metal layer M3.

As understood by those skilled in the art, these closer distances in the lateral direction and the existence of overlapping in the normal direction both contribute to increased capacitances between the first-terminal and second-terminal metal features 602 and 604 and thereby increase the overall parallel capacitance between the I/O terminal 506 and the ground terminal 508 in the ESD device 500 of FIGS. 5-7. Those skilled in the art will understand that the lateral distances and/or the normal overlap areas can be adjusted by modifying the sizes of the extensions of the metal features 602 and 604 to change the amount of parallel capacitance added to the ESD device 500. Further changes to the amount of parallel capacitance can be achieved by adjusting the thicknesses of one or more of metal layers M1-M3 and/or the distances between adjacent metal layers.

Figure 4:
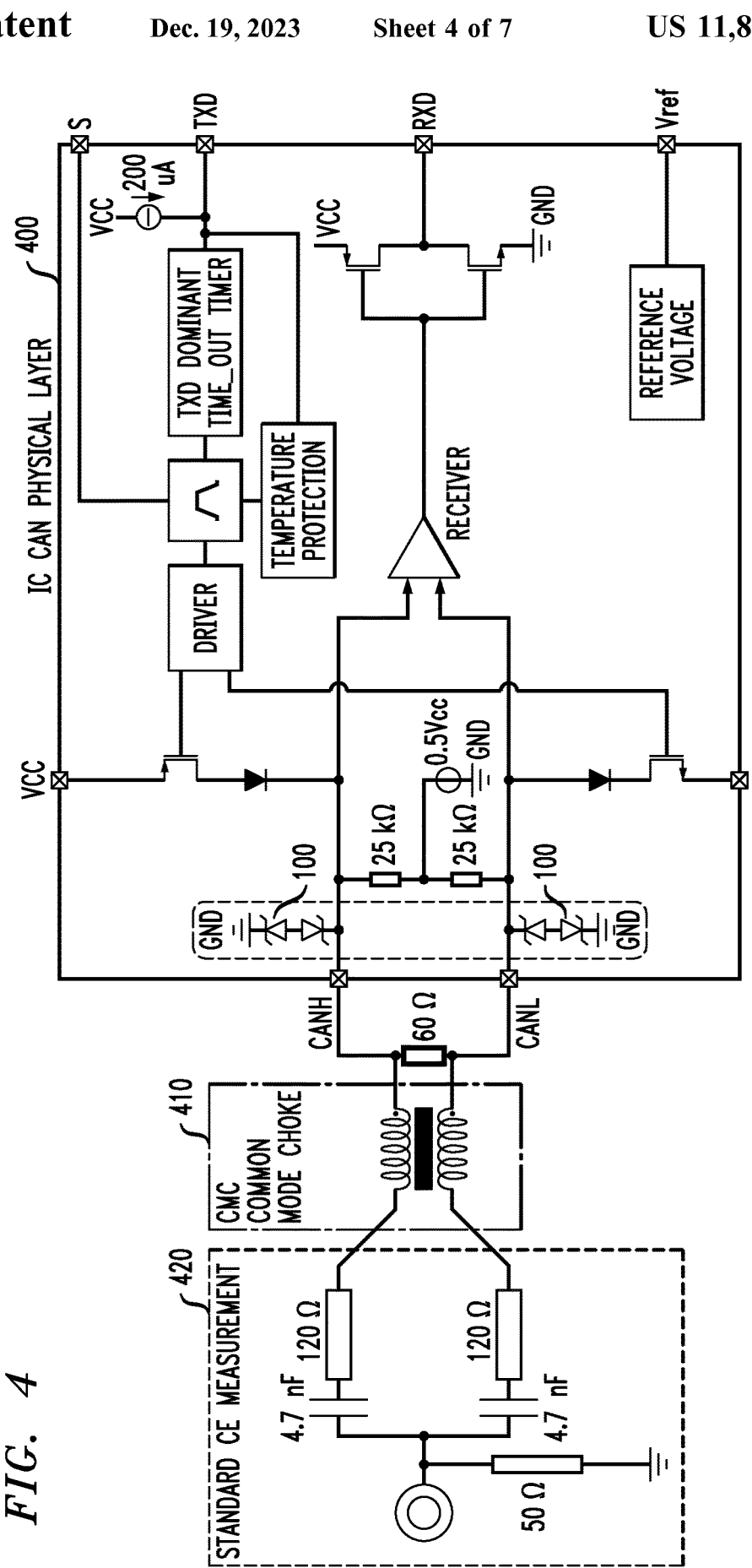
FIG. 4 is a schematic circuit diagram of a conventional, integrated, CAN physical-layer component configured for Conducted Emission (CE) testing.

This increased capacitance of the new ESD device 500 compared to that of the conventional ESD device 100 of FIGS. 1-3 improves the filtering of common-mode noise, even in the presence of significant asymmetry between the differential-signal components, when two instances of the new ESD device 500 are employed in the CAN physical-layer component 400 of FIG. 4 instead of the two conventional ESD devices 500.

Furthermore, because the ESD device 500 is implemented by extending the dimensions of certain metal features 602 and 604 in the manner shown in FIGS. 6 and 7 relative to the dimensions of the corresponding metal features 202 and 204 of the conventional ESD device 100 of FIGS. 1-3, the ESD device 500 can be implemented to have the same footprint and therefore the same layout area as the conventional ESD device 100. This characteristic makes new ESD devices of the present disclosure, like the new ESD device 500 of FIGS. 5-7, especially useful in updating the designs of existing integrated physical-layer components, like the CAN physical-layer component 400 of FIG. 4, by employing the new ESD devices instead of conventional ESD devices, like the ESD device 100 of FIGS. 1-3.

Although embodiments have been described in which two ESD devices of the disclosure are used in a CAN physical-layer component that converts a differential signal into a single-ended signal and vice versa, those skilled in the art will understand that ESD devices of the disclosure can be used in other applications, including differential physical-layer components for networks other than CAN networks as well as for single-ended physical-layer components connected to single-ended transmission lines.

Although embodiments of the ESD devices of the disclosure are described as having a bi-directional blocking silicon-controlled rectifier and four PNP transistors, those skilled in the art will understand that, in alternative embodiments, ESD devices of the disclosure may have (i) rectifiers other than bi-directional blocking SCRs (including, without limitation, uni-directional diodes and bi-directional back-to-back diode rectifiers) and/or (ii) fewer or more than four PNP transistors. Although the ESD devices of the disclosure are described as being implemented using bipolar technology, those skilled in the art will understand that, in alternative embodiments, ESD devices of the disclosure may be implemented using other suitable technologies, such as (without limitation) field-effect transistor (FET) technology.

Although embodiments of the ESD devices of the disclosure are described as having three metal layers M1-M3 with extended metal features, in general, ESD devices of the disclosure have extended metal features in two or more adjacent metal layers which may be the same as or different from metal layers M1, M2, and/or M3.

For purposes of this disclosure, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

Signals and corresponding terminals, nodes, ports, links, interfaces, or paths may be referred to by the same name and are interchangeable for purposes here.

Transistors are typically shown as single devices for illustrative purposes. However, it is understood by those with skill in the art that transistors will have various sizes (e.g., gate width and length) and characteristics (e.g., threshold voltage, gain, etc.) and may consist of multiple transistors coupled in parallel to get desired electrical characteristics from the combination. Further, the illustrated transistors may be composite transistors.

Unless explicitly stated otherwise, each numerical value and range should be interpreted as being approximate as if the word "about" or "approximately" preceded the value or range.

It will be further understood that various changes in the details, materials, and arrangements of the parts which have been described and illustrated in order to explain embodiments of this disclosure may be made by those skilled in the art without departing from embodiments of the disclosure encompassed by the following claims.

In this specification including any claims, the term "each" may be used to refer to one or more specified characteristics of a plurality of previously recited elements or steps. When used with the open-ended term "comprising," the recitation of the term "each" does not exclude additional, unrecited elements or steps. Thus, it will be understood that an apparatus may have additional, unrecited elements and a method may have additional, unrecited steps, where the additional, unrecited elements or steps do not have the one or more specified characteristics.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

All documents mentioned herein are hereby incorporated by reference in their entirety or alternatively to provide the disclosure for which they were specifically relied upon.

Reference herein to "one embodiment" or "an embodiment" means that a particular feature, structure, or characteristic described in connection with the embodiment can be included in at least one embodiment of the disclosure. The appearances of the phrase "in one embodiment" in various places in the specification are not necessarily all referring to the same embodiment, nor are separate or alternative embodiments necessarily mutually exclusive of other embodiments. The same applies to the term "implementation."

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

Unless otherwise specified herein, the use of the ordinal adjectives "first," "second," "third," etc., to refer to an object of a plurality of like objects merely indicates that different instances of such like objects are being referred to, and is not intended to imply that the like objects so referred-to have to be in a corresponding order or sequence, either temporally, spatially, in ranking, or in any other manner.

What is claimed is:

1. An article of manufacture comprising an integrated electro-static discharge (ESD) device, the ESD device comprising a set of metal layers, wherein:
   each metal layer in the set has one or more first-terminal metal features interleaved with one or more second-terminal metal features in a lateral direction; and
   at least one first-terminal metal feature in a metal layer of the set overlaps in a normal direction at least one second-terminal metal feature in an adjacent metal layer of the set;
   wherein the ESD device further comprises:
      interior first-terminal metal features disposed between second-terminal metal features in the lateral direction; and
      interior second-terminal metal features disposed between first-terminal metal features in the lateral direction;
   wherein each interior first-terminal metal feature in each metal layer of the set overlaps in the normal direction with at least one second-terminal metal feature in an adjacent metal layer of the set; and
   wherein each interior second-terminal metal feature in each metal layer of the set overlaps in the normal direction with at least one first-terminal metal feature in an adjacent metal layer of the set.

2. The article of claim 1, wherein:
   the first-terminal and second-terminal metal features are part of a parallel combination of a rectifier and at least one transistor; and
   the first-terminal and second-terminal metal features provide capacitance in parallel with the parallel combination.

3. The article of claim 2, wherein the rectifier comprises a diode.

4. The article of claim 3, wherein the rectifier comprises back-to-back diodes.

5. The article of claim 3, wherein the rectifier is a bi-directional blocking silicon-controlled rectifier (SCR).

6. The article of claim 2, wherein the parallel combination comprises one or more floating-base PNP transistors.

7. The article of claim 1, wherein the ESD device further comprises one or more other metal layers that are not in the set of metal layers.

8. The article of claim 1, wherein the article comprises an integrated physical-layer component comprising the ESD device.

9. The article of claim 8, wherein the physical-layer component is a differential physical-layer component comprising two instances of the ESD component, one for each differential input of the differential physical-layer component.

10. The article of claim 8, wherein the article comprises an in-vehicle network (IVN) product comprising the differential physical-layer component.

11. An electro-static discharge (ESD) device, the ESD device comprising a set of metal layers,
   wherein each metal layer in the set has one or more first-terminal metal features interleaved with one or more second-terminal metal features in a lateral direction that is parallel to a plane;
   wherein at least one first-terminal metal feature in a metal layer of the set overlaps, in a normal direction that is perpendicular to the plane, at least one second-terminal metal feature in an adjacent metal layer of the set; and
   wherein the ESD device is configured to provide an electrically conductive path between the first terminal metal features and the second terminal metal features when an electrical potential difference between the first terminal metal features and the second terminal metal features exceeds a predetermined voltage.

12. An electro-static discharge (ESD) device, the ESD device comprising:
   a set of metal layers formed on a substrate,
      wherein each metal layer in the set has one or more first-terminal metal features interleaved with one or more second-terminal metal features in a lateral direction that is parallel to a surface of the substrate;
      wherein at least one first-terminal metal feature in a metal layer of the set overlaps, in a normal direction that is perpendicular to the surface of the substrate, at least one second-terminal metal feature in an adjacent metal layer of the set; and
      wherein the ESD device is configured to provide an electrically conductive path between the first terminal metal features and the second terminal metal features when an electrical potential difference between the first terminal metal features and the second terminal metal features exceeds a predetermined voltage.

13. An article of manufacture comprising an integrated electro-static discharge (ESD) device, the ESD device comprising a set of metal layers, wherein:
   each metal layer in the set has one or more first-terminal metal features interleaved with one or more second-terminal metal features in a lateral direction; and
   at least one first-terminal metal feature in a metal layer of the set overlaps in a normal direction at least one second-terminal metal feature in an adjacent metal layer of the set;
   wherein the first-terminal and second-terminal metal features are part of a parallel combination of a rectifier and at least one transistor; and
   wherein the first-terminal and second-terminal metal features provide capacitance in parallel with the parallel combination.

14. The article of claim 13, wherein the rectifier comprises a diode.

15. The article of claim 14, wherein the rectifier comprises back-to-back diodes.

16. The article of claim 14, wherein the rectifier is a bi-directional blocking silicon-controlled rectifier (SCR).

17. The article of claim 13, wherein the parallel combination comprises one or more floating-base PNP transistors.

18. The ESD device of claim 11, further comprising:
  interior first terminal metal features that are disposed between two adjacent second-terminal metal features in the lateral direction; and interior second terminal features disposed between two first-terminal features;
  wherein each interior first-terminal metal feature overlaps in the normal direction with at least one second-terminal metal feature in a metal layer of the set that is adjacent to that interior-first terminal feature in the normal direction; and
  wherein each interior second-terminal metal feature overlaps in the normal direction with at least one first-terminal metal feature in a metal layer of the set that is adjacent to that interior-second-terminal feature in the normal direction.

19. The ESD device of claim 12, further comprising:
  interior first terminal metal features that are disposed between two adjacent second-terminal metal features in the lateral direction; and interior second terminal features disposed between two first-terminal features;
  wherein each interior first-terminal metal feature overlaps in the normal direction with at least one second-terminal metal feature in a metal layer of the set that is adjacent to that interior-first terminal feature in the normal direction; and
  wherein each interior second-terminal metal feature overlaps in the normal direction with at least one first-terminal metal feature in a metal layer of the set that is adjacent to that interior-second-terminal feature in the normal direction.

* * * * *